(12) United States Patent
Van Bezooijen et al.

(10) Patent No.: US 7,821,273 B2
(45) Date of Patent: Oct. 26, 2010

(54) CIRCUIT FOR DETECTING THE IMPEDANCE OF A LOAD

(75) Inventors: Adrianus Van Bezooijen, Molenhoek (NL); Christophe Chanlo, Wijchen (NL)

(73) Assignee: Epcos AG, Munich (DE)

( * ) Notice: Subject to any disclaimer, the term of this patent is extended or adjusted under 35 U.S.C. 154(b) by 489 days.

(21) Appl. No.: 11/575,307

(22) PCT Filed: Sep. 9, 2005

(86) PCT No.: PCT/IB2005/052957

§ 371 (c)(1),
(2), (4) Date: Jan. 14, 2008

(87) PCT Pub. No.: WO2006/030360

PCT Pub. Date: Mar. 23, 2006

(65) Prior Publication Data

US 2008/0186032 A1    Aug. 7, 2008

(30) Foreign Application Priority Data

Sep. 14, 2004    (EP) .................................. 04104433

(51) Int. Cl.
*G01R 27/04*    (2006.01)

(52) U.S. Cl. .......................... 324/646; 327/58; 455/107; 455/115.4; 455/123

(58) Field of Classification Search .................. 324/646
See application file for complete search history.

(56) References Cited

U.S. PATENT DOCUMENTS

| 4,262,246 | A | * | 4/1981 | Fujii ........................... 324/646 |
| 4,290,009 | A | * | 9/1981 | Sanpei et al. ............... 324/646 |
| 4,483,112 | A |   | 11/1984 | Rueblinger |
| 4,483,680 | A |   | 11/1984 | Daly |
| 4,493,112 | A | * | 1/1985 | Bruene ....................... 455/123 |
| 4,721,901 | A | * | 1/1988 | Ashley ....................... 324/646 |
| 4,962,359 | A | * | 10/1990 | Dunsmore .................. 324/638 |
| 5,408,690 | A | * | 4/1995 | Ishikawa et al. ......... 455/115.4 |
| 5,483,680 | A | * | 1/1996 | Talbot ........................ 455/107 |
| 6,060,888 | A | * | 5/2000 | Blackham et al. ........... 324/601 |
| 6,192,318 | B1 | * | 2/2001 | Yogo et al. .................... 702/65 |
| 6,819,052 | B2 | * | 11/2004 | Kitamura et al. ........ 315/111.21 |
| 6,917,245 | B2 | * | 7/2005 | Dupuis et al. ................ 330/279 |
| 2004/0027138 | A1 | * | 2/2004 | Pickerd et al. .............. 324/646 |
| 2004/0257093 | A1 | * | 12/2004 | Sakiyama .................... 324/650 |

FOREIGN PATENT DOCUMENTS

EP    0 662 753 B1    9/1998

* cited by examiner

*Primary Examiner*—Timothy J Dole
*Assistant Examiner*—Benjamin M Baldridge
(74) *Attorney, Agent, or Firm*—Slater & Matsil, L.L.P.

(57) ABSTRACT

The invention refers to a circuit and a method for detecting the impedance of a load, whereby the circuit and the method can be used by an impedance matching circuit. Impedance matching circuits need a complex algorithm to adjust the impedance accordingly. This algorithm renders the response time to be long. It has been found out that the complexity partially stems from the fact that the phase of the reflection coefficient is not known over the full range of 0° to 360°. A quadrature phase detector is used to provide the full phase information.

11 Claims, 6 Drawing Sheets

CIRCUIT FOR DETECTING THE IMPEDANCE OF A LOAD

The present invention relates, in general, to semiconductor circuits and, more particularly, to radio frequency (RF) circuits. More specifically, the invention refers to a circuit and a method for detecting the impedance of a load, whereby the circuit and the method can be used by an impedance matching circuit.

The performance of an RF power amplifier depends on the impedance or admittance of a load coupled to the output of the RF power amplifier. An RF power amplifier is generally designed to have an optimum performance when the load impedance has a predetermined value such as, for example, 50Ω. For reasons of convenience the RF power amplifier will be abbreviated RF amplifier. If the RF amplifier feeds an antenna, for example an antenna used in hand-held communication devices such as mobile phones and the like, environmental conditions may change the impedance of the antenna (load). The moving hand and head of the user, and other nearby objects, cause large disturbances in the antenna impedance. However, when the antenna impedance differs from the predetermined value, the performance, such as output power, efficiency, linearity, etc., of the power amplifier is degraded.

It is well known to place a circulator between the power amplifier and the antenna to account for the above mentioned problem. The circulator has a first terminal coupled to the output of the power amplifier, a second terminal coupled to the antenna, and a third terminal coupled to ground via a device having a fixed impedance, e.g., 50Ω. The output signal of the power amplifier is transmitted to the antenna through the first and second terminal of the isolator. The signal reflected back from the antenna due to an impedance mismatch is transmitted to ground via the third terminal of the isolator and the fixed impedance device. Thus, the impedance mismatch of the antenna does not affect the performance of the power amplifier. However, an isolator is big, expensive, and power inefficient. It is not suitable for use in low cost, low power, portable communication systems.

U.S. Pat. No. 4,493,112 refers in FIG. 1, to a piece of prior art in which a circuit detects both the impedance and the phase of an antenna, whereby the antenna is coupled to an RF amplifier. Voltage sensors and current sensors are used to determine the magnitude of the impedance.

U.S. Pat. No. 5,483,680 discloses a circuit for matching the impedance of an antenna. The circuit comprises an impedance matching network which is driven by two control signals. The two control signals are the output of a quadrature phase detector. Control is based on a simultaneous minimization of the two control signals.

It is an object of the invention to provide a circuit and a method for detecting the impedance or the admittance of a load with which the control of an impedance matching circuit can be simplified. Another object is to provide an impedance matching network with a simpler control and a faster response time.

These and other objects are solved by the features of the independent claims. Further embodiments of the invention are described by the features of the dependent claims. It should be emphasized that any reference signs in the claims shall not be construed as limiting the scope of the invention.

According to the invention the above-mentioned problem concerning the circuit for detecting the impedance or the admittance of a load is solved by a circuit which comprises a directional coupler having input terminals being connectable to an RF amplifier, and being connectable to the load. The directional coupler has output terminals being connected to:
a) first means for measuring the magnitude of the voltage or the magnitude of the current of the forward wave, and
b) second means for measuring the magnitude of the voltage or the magnitude of the current of the reflected wave, and
c) a quadrature phase detector, whereby the quadrature phase detector is arranged to output signals providing information on the phase $\theta$ of the reflection coefficient $\Gamma$ within a range of 0° to 360°.

According to the invention, the above-mentioned problem concerning the impedance matching circuit is solved by a impedance matching circuit having an adjustable output matching network which is connectable or which is connected to an RF amplifier by means of a feed line. The adjustable output matching network (which will be abbreviated "network" in the following) is connectable or is connected to a load by means of the feed line. The load can be an antenna, for example an antenna of a hand-held communication device such as a mobile phone, a smartcard or the like. The network comprises a detector for measuring the impedance or the admittance of the load, whereby the detector is connectable or is connected to a node of the feed line. The output of the detector serves as an input for a control unit. This unit controls the output of the adjustable output matching network. The control unit is connected to the detector, whereby the detector is a circuit according to the last paragraph.

The circuit and the impedance adjustment network are designed to operate in the radio frequency range, thus in the frequency range between about 10 kHz and about 10 GHz.

According to the invention, the above-mentioned problem concerning the method for detecting the impedance or the admittance of a load is solved by a method in which in a first step a directional coupler is arranged between an RF amplifier and a load. Then the magnitude of the voltage or the magnitude of the current of the forward wave, and the magnitude of the voltage or the magnitude of the current of the reflected wave is measured. Furthermore, the phase $\theta$ of the reflection coefficient $\Gamma$ is measured within a range of 0° to 360°, preferably by means of a quadrature phase detector.

The inventors of the present invention found out that impedance matching becomes simpler when detectors provide a full phase information with respect to the reflection coefficient $\Gamma$. A full phase information is provided when the phase $\theta$ of the reflection coefficient $\Gamma$ is known within a range of 0° to 360°.

Detectors which provide a phase information within a range of $\theta=0°$ to $\theta=360°$, and not only within a range of $\theta=0°$ to $\theta=180°$, do not need an algorithm for controlling the impedance adjustment in the adjustable output matching network which includes search routines in multiple dimensions, and self-learning, in order to compensate for the lack of phase information. In this way, the solution according to the invention allows a simpler control algorithm.

A simpler control algorithm in turn makes the adjustment of the impedance faster and the response time of the impedance adjustment network shorter.

In addition, the above-mentioned approach avoids the risk of finding a sub-optimal local minimum, such that the result according to the invention is more reliable than with solutions working with a phase information within a range of θ=0° to θ=180° only.

An additional advantage of the present invention is a less intense input/output interfacing with base band in comparison to solutions of the prior art.

First means and the second means are provided to measure the magnitude of the voltage or the magnitude of the current of both the forward/incident wave and the reflected wave. If $V_f$ is the voltage of the forward wave, and $V_r$ is the voltage of the reflected wave, then the reflection coefficient Γ is defined as $$\Gamma = \frac{V_r}{V_f} = |\Gamma| * \exp(j\theta) = \frac{|V_r|}{|V_f|} \exp(j\theta),$$

whereby θ is the phase of the reflection coefficient. The phase θ is the phase difference between the phase $\theta_r$ of the reflected wave and the phase $\theta_i$ of the incident wave:

θ = $\theta_r$-$\theta_i$.The
phase θ can be any value between −180° and +180°.

Preferably, the first means and the second means are both peak detectors. The peak detectors may comprise a mixer and an amplitude limiter. Furthermore, the first means and the second means may comprise buffer amplifiers to provide an electric isolation between them and the RF amplifier.

The quadrature phase detector may be an all-pass filter comprising a 90° phase shifter. The output signals of the quadrature phase detector are a signal proportional to sin(θ), and a signal proportional to cos(θ). θ can then be calculated by means of mathematical post processing in the following way:

$$\text{If } \cos(\theta) > 0 \text{ then } \theta = \arctan\left(\frac{\cos(\theta)}{\sin(\theta)}\right), \text{ else}$$

$$\text{if } \sin(\theta) >= 0 \text{ then } \theta = 180° - \arctan\left(\frac{\cos(\theta)}{\sin(\theta)}\right), \text{ else}$$

$$\theta = -180° + \arctan\left(\frac{\cos(\theta)}{\sin(\theta)}\right)$$

If $V_f$, $V_r$, and the characteristic impedance $Z_0$ of the adjustable output matching network is known, major properties necessary for both the output power control of the power amplifier, and for the output matching by means of the adjustable output matching network can be calculated.

The incident power is $$P_f = \frac{V_f^2}{2Z_0},$$

the reflected power is $$P_r = \frac{V_r^2}{2Z_0},$$

and the dissipated power $P_d$ is $$P_d = P_f - P_r.$$

From |Γ| the voltage standing wave ratio (VSWR) can be determined by $$VSWR = \frac{1+|\Gamma|}{1-|\Gamma|}.$$

Most important, the impedance of the load is $$Z_{load} = Z_0 * \frac{1+\Gamma}{1-\Gamma}.$$

Corresponding to the circuit for detecting the impedance or the admittance of a load as described in the last paragraphs the invention also relates to an impedance matching circuit comprising such a circuit. For simplicity, the circuit for detecting the impedance or the admittance of a load will be called a detector in the following paragraphs.

The impedance matching circuit further comprises an adjustable output matching network being connectable or being connected to an RF amplifier by means of a feed line. The detector probes the feed line at a node which is either between the RF amplifier and the network, or between the network and the load. In the first case the detector senses the input impedance of the RF amplifier. In the second case the detector senses the antenna impedance.

These and other aspects of the invention will be apparent from and elucidated with reference to the embodiments described thereafter.

Figure 1:
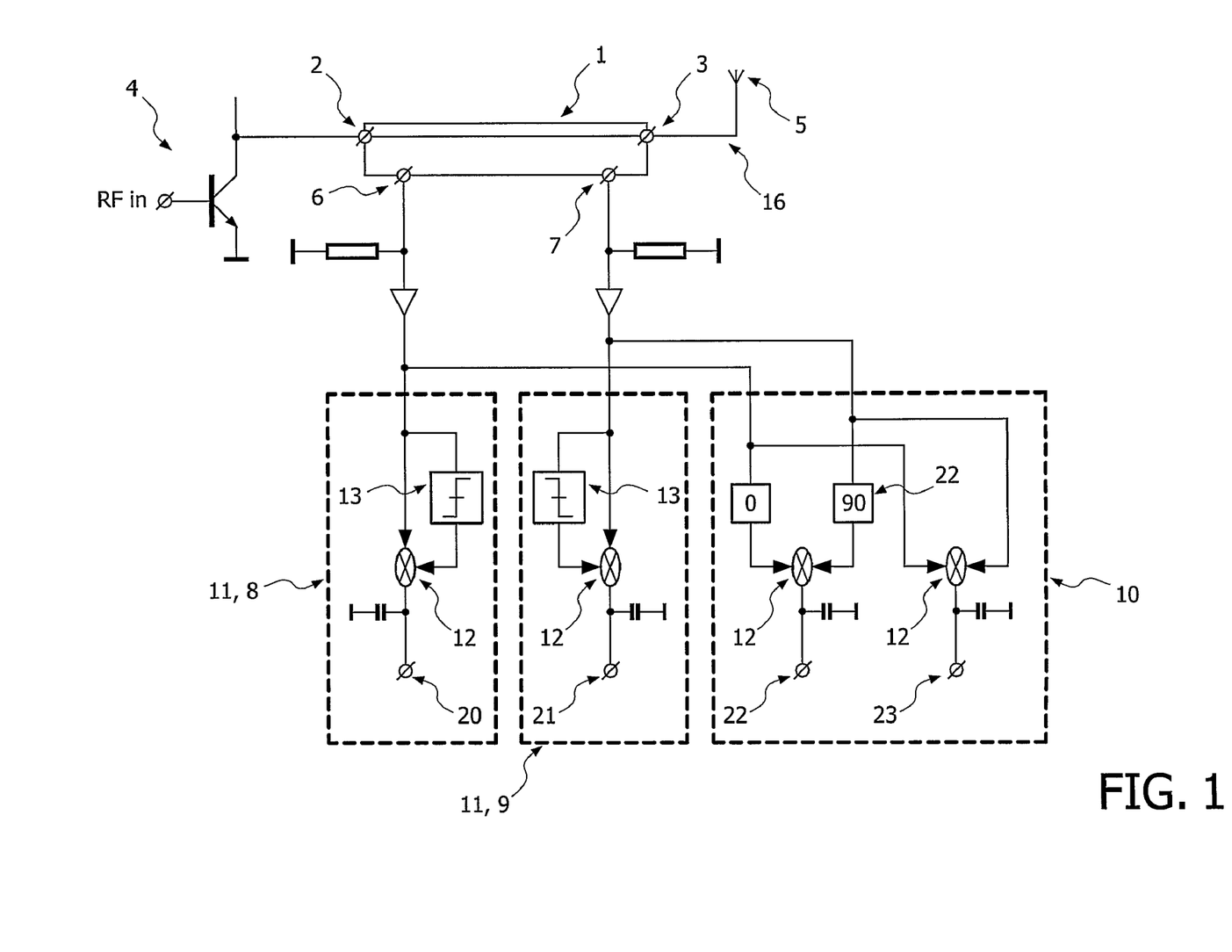
FIG. 1 shows a high level block diagram the impedance detector.

FIG. 1 is a high-level block diagram illustrating the circuit for detecting the impedance of an antenna. The antenna is an antenna designed for mobile phones. A RF output/input 4 serves to transmit electromagnetic waves to an antenna 5 when the mobile phone sends audio signals, and to receive electromagnetic waves from the antenna if it receives audio signals. In the case of waves received from antenna 5, the waves travel via the feed line 16 to the input terminal 3 of a directional coupler 1, and then from terminal 2 to the RF input/output 4. The directional coupler 1 detects both the forward or incident wave travelling from the antenna to the RF input/output 4, as well as the reflected wave travelling back. The directional coupler 1 is a standard directional coupler known in the prior art, thus that internal details of this electronic components are known to the man skilled in the art.

The directional coupler 1 has two output terminals, namely a first output port 6 representative for the incident wave, and a second output-terminal 7 representative for the reflected wave.

Output terminal 6 is connected with first means 8 for measuring the magnitude of the voltage of the incident wave. The embodiment shown uses a peak detector 11 as a first means 8, whereby the peak detector 11 comprises a mixer 12 and an amplitude limiter 13. Input/output terminal 20 of the first means 8 thus outputs the magnitude of the voltage $|V_i|$ of the incident wave.

Output terminal 7 is connected with second means 9 for measuring the magnitude of the voltage $|V_r|$ of the reflected wave. The embodiment shown uses a peak detector 11 as a second means 9, whereby the peak detector 11 comprises a mixer 12 and an amplitude limiter 13. Input/output terminal 21 of the second means 9 thus outputs the magnitude of the voltage $|V_r|$ of the reflected wave.

Output terminals 6 and 7 are both connected to a quadrature phase detector 10 which is adapted to output signals providing information on the phase θ of the reflection coefficient Γ within a range of 0° to 360°. The quadrature phase detector 10 itself is known to the man skilled in the art, and may comprise two mixers 12 and a 90° phase shifter 22. Output terminal 22 outputs a signal $|V_i|*|V_r|* \sin(\theta)$, whereas output terminal 23 outputs a signal $|V_i|*|V_r|* \cos(\theta)$.

Figure 2:
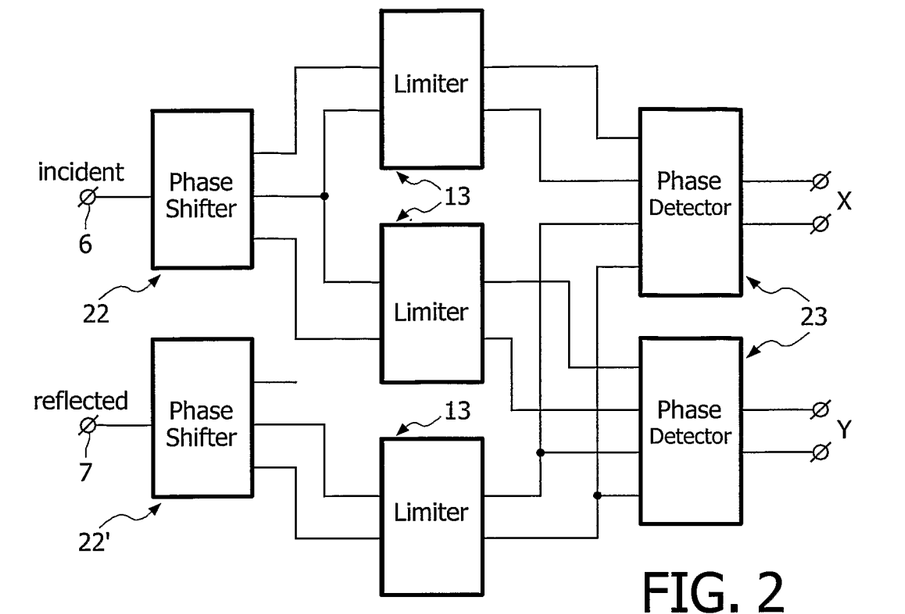
FIG. 2 shows a block diagram of the quadrature phase detector.

FIG. 2 shows a block diagram of a quadrature phase detector 10, comprising two phase shifters 22, 22', three amplitude limiters 13, and two phase detectors 23. The two phase shifters 22, 22' shown in FIG. 2 also serve for balancing/unbalancing the total circuit for the input RF signal. Furthermore, to avoid errors two phase shifters are used, although in principle a single phase shifter would be sufficient. The output at the output terminal x is $|V_i|*|V_r|*\sin(\theta)$, the output at the output terminal y is $|V_i|*|V_r|*\cos(\theta)$.

Figure 3:
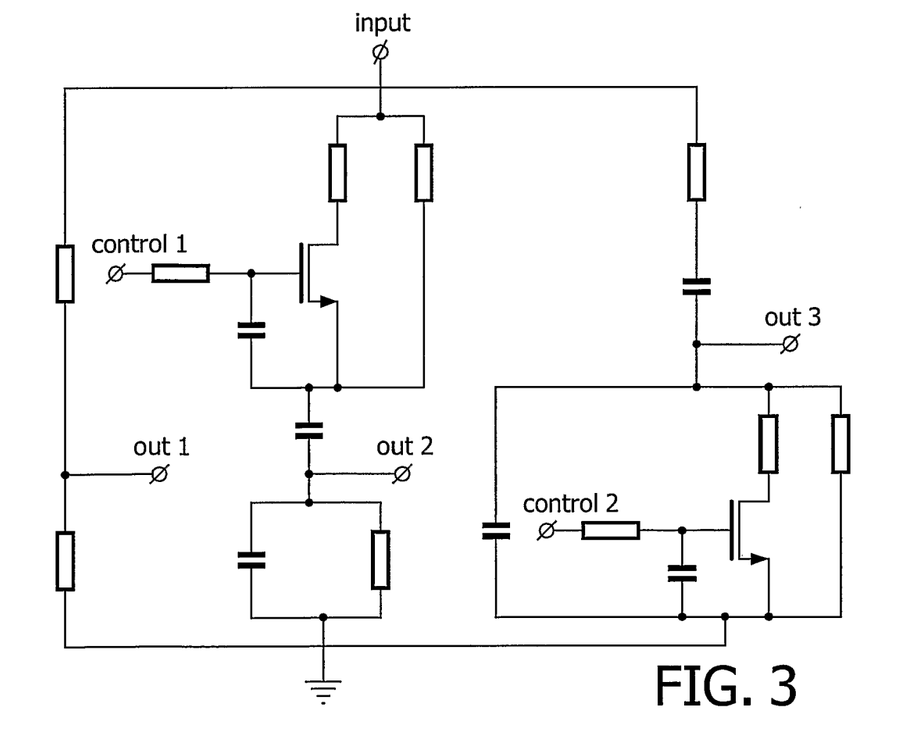
FIG. 3 shows a phase shifter which can be used for carrying out the invention.

The phase shifters 22, 22' are shown in more detail in FIG. 3. It is basically an all-pass filter where MOS circuits are added as tunable/variable resistances. This generally known type of phase shifter has three outputs terminals out1, out2, and out3. In FIG. 2, the three output terminals of the phase shifters 22, 22' are (from top to bottom) out2, out1 and out3. As can be seen in FIG. 2, one output terminal of the phase shifter 22' is left open, namely out2 which provides the differential voltage. This helps to compensate for phase differences due to different path lengths of the signals in the electronic components. With this phase shifter the impedance detector becomes simple to implement, is tunable, has a large frequency bandwidth, and has a high accuracy. Furthermore, the phase shifter serves for balancing the circuit.

The three limiters of FIG. 2 are included such that the total phase detection has more than 40 dB of dynamic range. However, the concept of quadrature detection is still feasible without limiters. Two types of limiters were used for prototypes of the impedance detector. They are shown in the upper and lower part of FIG. 4. These limiters made it possible to achieve 40 dB of dynamic range.

Figure 5:
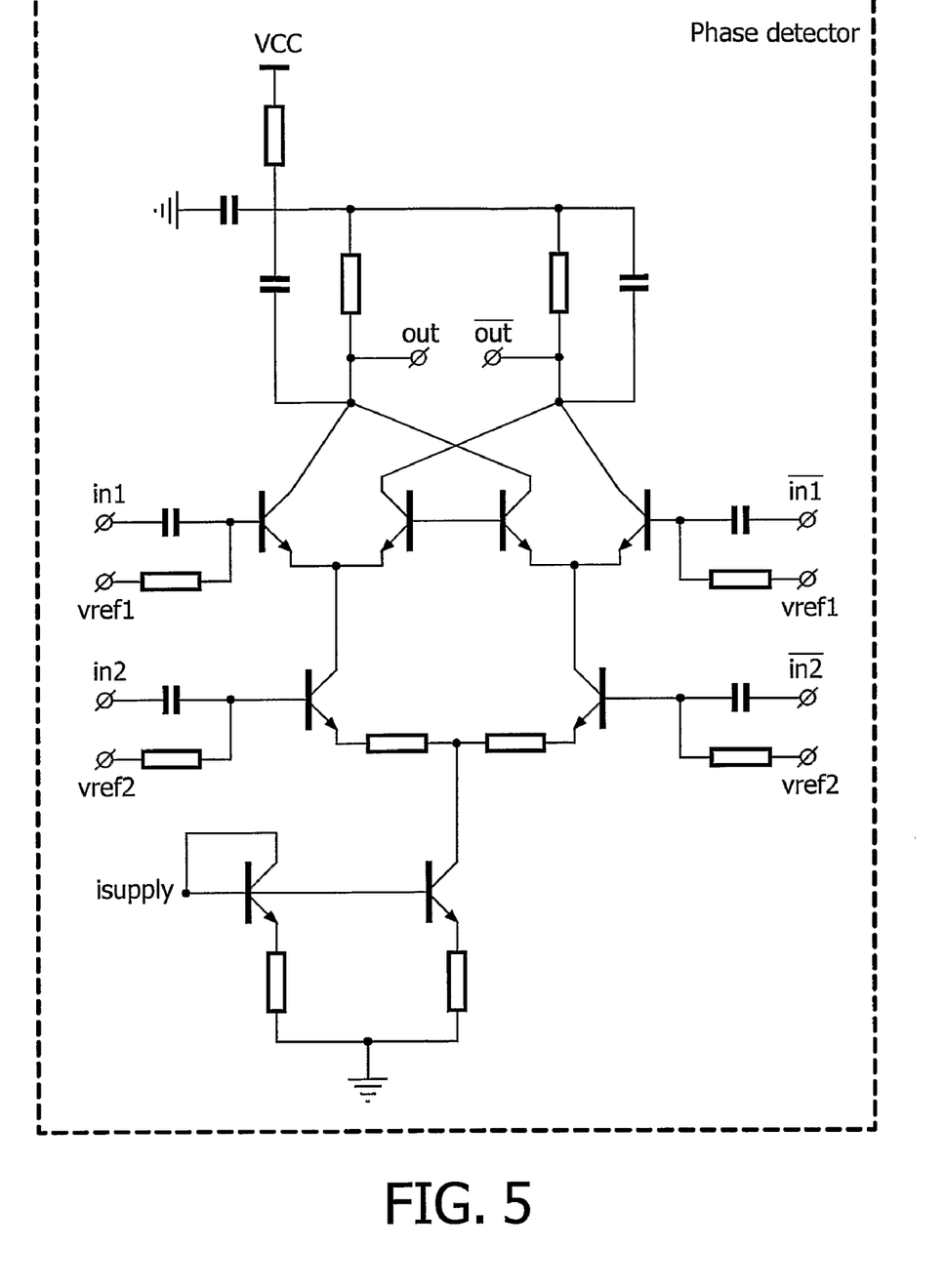
FIG. 5 shows a phase detector which can be used for carrying out the invention, FIG. 6 values of a measurement of a complete Γ-plane, FIG. 7 a first embodiment of the impedance matching circuit, FIG. 8 a second embodiment of the impedance matching circuit.

FIG. 5 shows a phase detector which can be used to carry out the invention. This type of phase detector is basically known in the prior art. It is a balanced type of phase detector to guarantee limited influence of parasitic effects.

Figure 4:
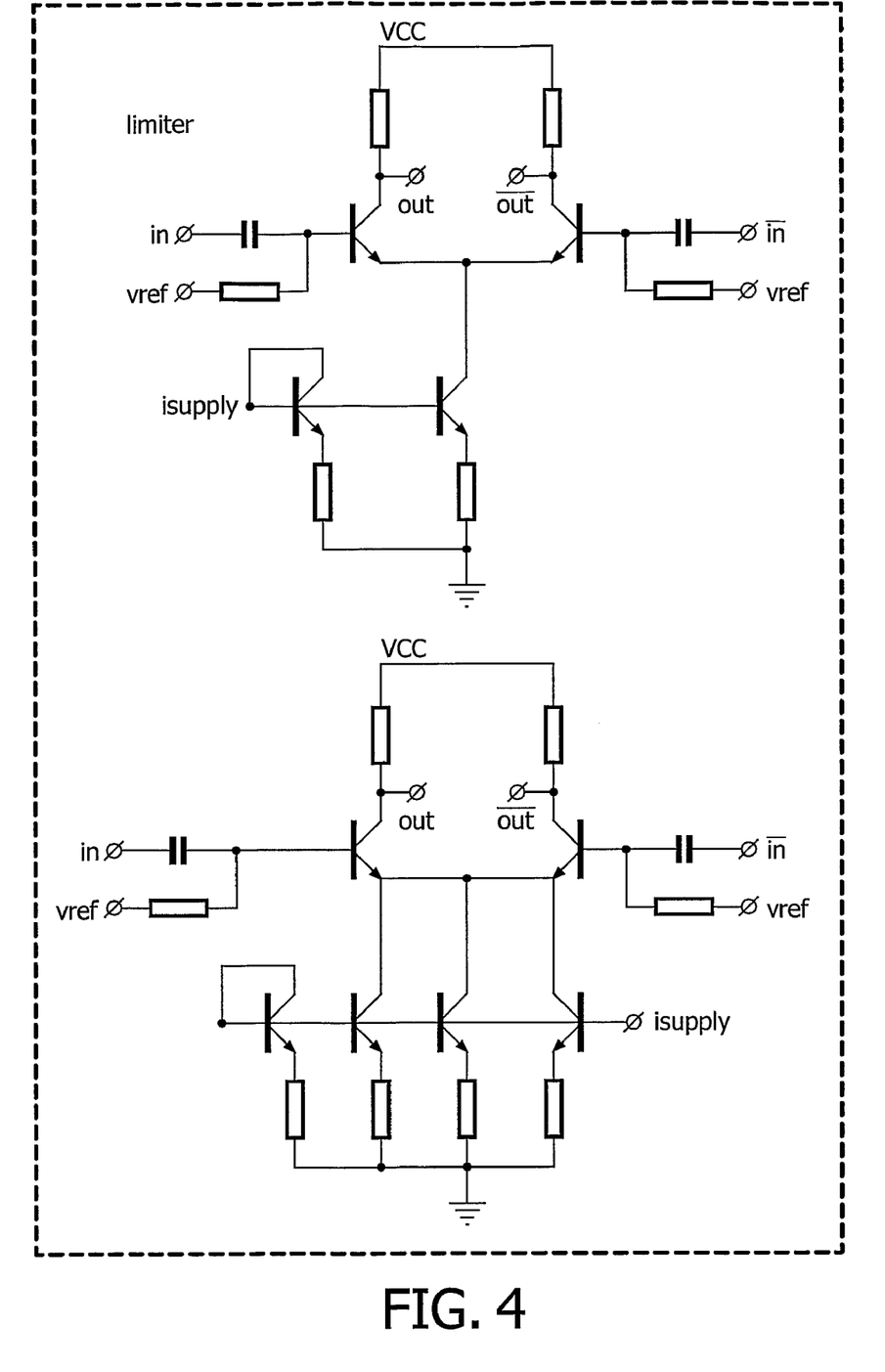
FIG. 4 shows (amplitude) limiters which can be used for carrying out the invention.
Figure 6:
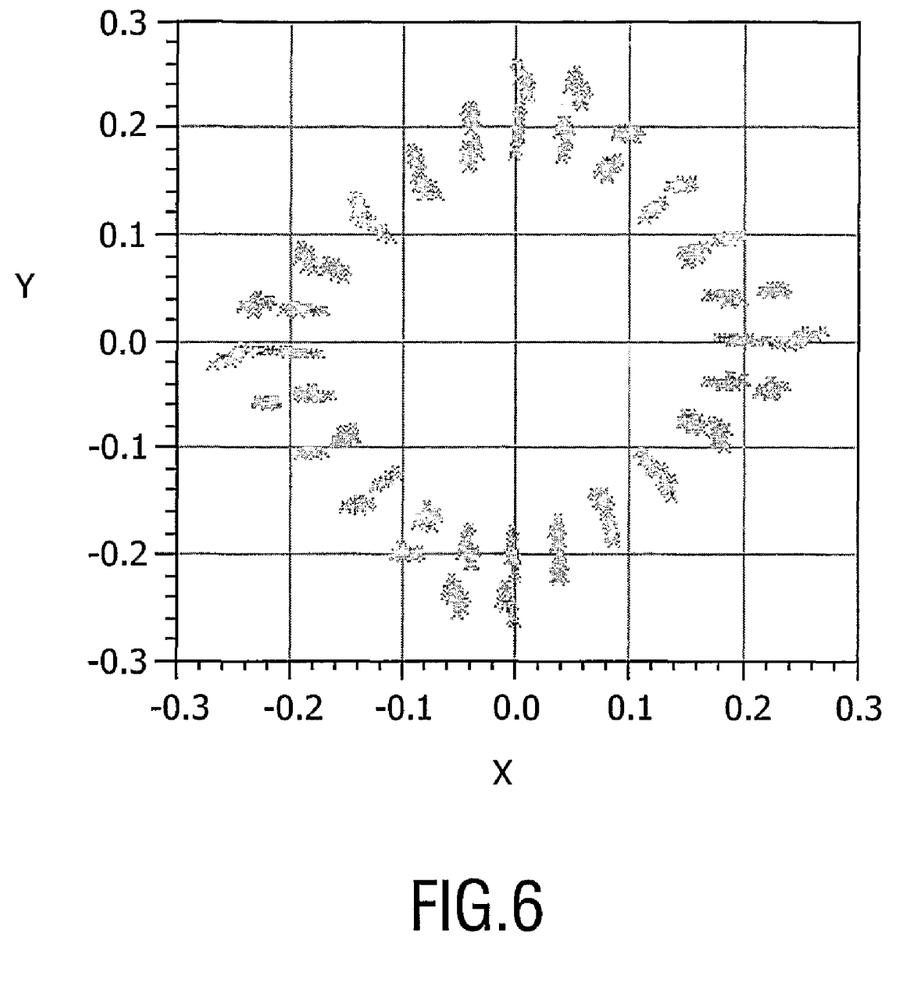

FIG. 6 show experimental results obtained with the circuit of FIG. 1 using a quadrature phase detector according to FIG. 2, whereby the phase detector 10 comprises phase shifters according to FIG. 3 and limiters according to FIG. 4. The supply voltage of the limiters were 2.9 V and 4.7 V. The frequency was in the range between 0.8 GHz and 1.0 GHz, the temperature between −25° C. and +85° C., and the input power 5 dBm, 10 dBm and 35 dBm. In FIG. 6 the output $y=|V_i|*|V_r|* \cos(\theta)$ is plotted versus the output $x=|V_i|*|V_r|* \sin(\theta)$. The plot is the $^-$ plane and shows that a full phase information was obtained.

Figure 7:
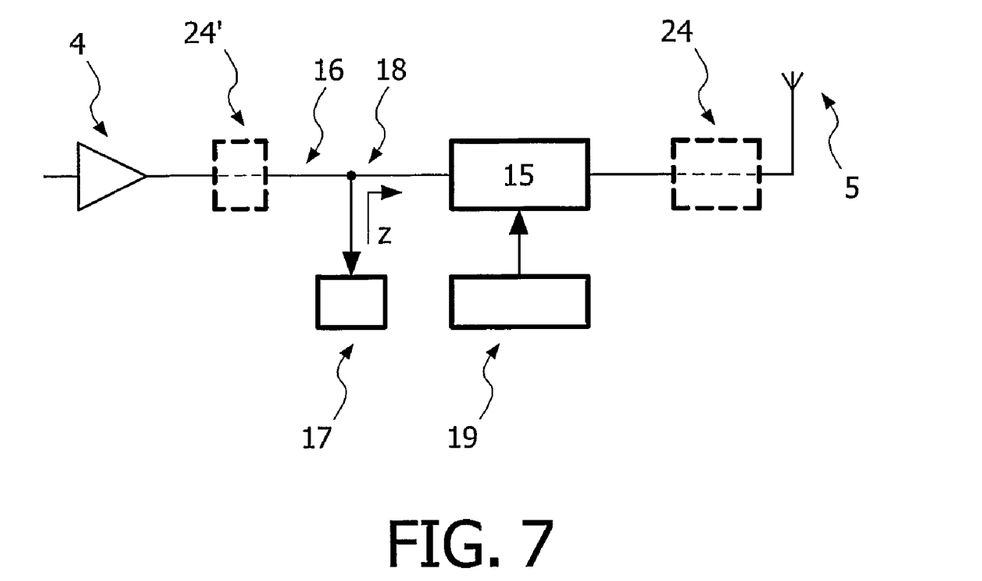
Figure 8:
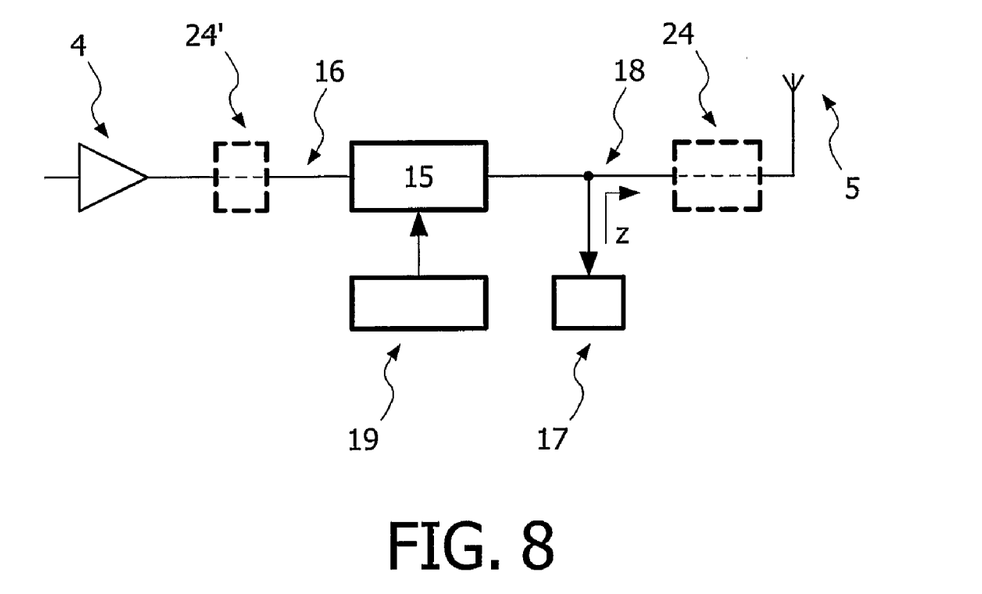

FIGS. 7 and 8 show how the impedance detector as described above can be used as a part of an impedance matching circuit. In FIG. 7 the power amplifier 4 feeds the antenna 5 by means of feed line 16. An adaptive output network 15 serves to adapt the impedance of the antenna to the impedance of the power amplifier 4. In the arrangement of FIG. 7, the impedance detector 17 according to the present invention is arranged to sense the impedance at node 18, and thus to sense the matched impedance. In other words impedance detector 17 measures the impedance in the energy flow (z direction) direction from left to right (or from the power amplifier 4 to the antenna 5) from node 18 onward. In this respect FIG. 7 shows a feedback system. A control unit 19 provides the logic to compare the matched impedance with the impedance of the power amplifier 4, and to adjust the output of the adaptive output network accordingly. If desired, one or two optional fixed output networks 24, 24' can be added.

FIG. 8 the impedance detector 17 according to the present invention is placed between the adaptive output network 15 and antenna 5 at node 18. In this case the detector 17 senses the antenna impedance, and not the matched impedance. The reason is, that the detector measures the impedance in the energy flow direction from left to right (or from the power amplifier 4 to the antenna 5 in the z direction) from node 18 onward. In this respect FIG. 8 shows a feed forward system.

LIST OF REFERENCE NUMERALS 01 directional coupler
02 input terminal
03 input terminal
04 radio frequency (RF) amplifier
05 load
06 input/output terminal
07 input/output terminal
08 means for measuring the magnitude of the voltage/current of the incident wave
09 means for measuring the magnitude of the voltage/current of the reflected wave
10 quadrature phase detector
11 peak detector
12 mixer
13 amplitude limiter
14 buffer amplifier
14' buffer amplifier
15 adjustable output matching network
16 feed line
17 detector
18 node
19 control unit
20 input/output terminal
21 input/output terminal
22 phase shifter
23 phase detector
24 fixed output network
24' fixed output network

The invention claimed is:

1. A circuit for detecting an impedance or an admittance of a radio frequency or microwave load, comprising:
   a directional coupler having input terminals connected to a radio frequency or microwave amplifier and connected to the load;

the directional coupler having a first output terminal connected to a first peak detector for measuring a magnitude of a voltage or a magnitude of a current of a forward wave, wherein the first peak detector comprises a first mixer and a first amplitude limiter, and wherein the forward wave is inputted to a first input port of the mixer, and the forward wave is also inputted to the amplitude limiter, and the output of the amplitude limiter is inputted to a second input port of the mixer;

the directional coupler having an second output terminal connected to a second peak detector for measuring the magnitude of a voltage or a magnitude of a current of a reflected wave, wherein the second peak detector comprises a second mixer and a second amplitude limiter, and wherein the reflected wave is inputted to a first input port of the second mixer, and the reflected wave is also inputted into the second amplitude limiter, and the output of the second amplitude limiter is inputted to a second input port of the second mixer; and a quadrature phase detector being arranged to output signals providing information on the phase θ of the reflection coefficient Γ within a range of 0° to 360°.

2. Circuit according to claim 1, in which the first peak detector and the second peak detector comprise buffer amplifiers.

3. Circuit according to claim 1, whereby the signals providing information on the phase θ are a signal proportional to sin(θ), and a signal proportional to cos(θ).

4. Circuit according to claim 1, whereby the quadrature phase detector is an all-pass filter comprising a 90° phase shifter.

5. A method for detecting the impedance or the admittance of a radio frequency or microwave load, the method comprising the following steps:

arranging a directional coupler between a radio frequency (RF) or microwave amplifier and a load;

arranging the output of a forward wave by the RF or microwave amplifier, the forward wave traveling towards the load;

measuring a magnitude of a voltage or a magnitude of a current of the forward wave, wherein the measuring the magnitude of the voltage or the magnitude of the current of the forward wave is performed by peak detection using a first peak detector comprising a mixer and an amplitude limiter, wherein the forward wave is inputted to a first input port of the mixer, and the forward wave is also inputted to the amplitude limiter, and the output of the amplitude limiter is inputted to a second input port of the mixer;

measuring a magnitude of a voltage or a magnitude of a current of a reflected wave, wherein the measuring the magnitude of the voltage or the magnitude of the current of the reflected wave is performed by peak detection using a second peak detector comprising a mixer and an amplitude limiter, wherein the reflected wave is inputted to a first input port of the mixer, and the reflected wave is also inputted into the amplitude limiter, and the output of the amplitude limiter is inputted to a second input port of the mixer; and measuring the phase θ of the reflection coefficient Γ within a range of 0° to 360°.

6. Method according to claim 5, whereby measuring the phase θ of the reflection coefficient Γ is done by means of a quadrature phase detector.

7. An impedance matching circuit comprising:

an adjustable output matching network connected to a radio frequency (RF) or microwave amplifier by a feed line, the adjustable output matching network connected to a load by means of the feed line;

a detector for measuring the impedance or an admittance of the load, the detector connected to a node of the feed line, the detector comprising:

a directional coupler having input terminals connected to a radio frequency or microwave amplifier and connected to the load, the directional coupler having output terminals connected to:

a first peak detector for measuring a magnitude of a voltage or a magnitude of a current of a forward wave, wherein the first peak detector comprises a first mixer and a first amplitude limiter, and wherein the forward wave is inputted to a first input port of the mixer, and the forward wave is also inputted into the amplitude limiter, and the output of the amplitude limiter is inputted to a second input port of the mixer; and a second peak detector for measuring a magnitude of a voltage or a magnitude of a current of a reflected wave, wherein the second peak detector comprises a second mixer and a second amplitude limiter, and wherein the reflected wave is inputted to a first input port of the second mixer, and the reflected wave is also inputted into the second amplitude limiter, and the output of the second amplitude limiter is inputted to a second input port of the second mixer;

a quadrature phase detector being arranged to output signals providing information on the phase θ of the reflection coefficient Γ within a range of 0° to 360°; and a unit for controlling the output of the adjustable matching network the control unit being connected to the detector.

8. Impedance matching circuit according to claim 7, whereby the node is located between the RF amplifier and the adjustable output matching network.

9. Impedance matching circuit according to claim 7, whereby the node is located between the adjustable output matching network and the load.

10. Impedance matching circuit according to claim 7, whereby the signals providing information on the phase θ are a signal proportional to sin(θ), and a signal proportional to cos(θ).

11. Impedance matching circuit according to claim 7, whereby the quadrature phase detector is an all-pass filter comprising a 90° phase shifter.

* * * * *